United States Patent
Shono

(10) Patent No.: US 8,675,326 B2
(45) Date of Patent: Mar. 18, 2014

(54) BIDIRECTIONAL SWITCH AND CHARGE/DISCHARGE PROTECTION DEVICE USING SAME

(75) Inventor: Ken Shono, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/368,763

(22) Filed: Feb. 8, 2012

(65) Prior Publication Data

US 2012/0275076 A1 Nov. 1, 2012

(30) Foreign Application Priority Data

Apr. 28, 2011 (JP) ................................. 2011-100356

(51) Int. Cl.
*H02H 3/00* (2006.01)
*H02J 7/00* (2006.01)

(52) U.S. Cl.
USPC ................ 361/79; 361/82; 307/127; 320/128

(58) Field of Classification Search
USPC ............ 361/86, 79, 82; 307/64, 127; 320/128
See application file for complete search history.

(56) References Cited

U.S. PATENT DOCUMENTS

| 5,808,446 | A * | 9/1998 | Eguchi | 320/134 |
| 6,172,479 | B1 * | 1/2001 | Barton | 320/121 |
| 7,843,708 | B2 * | 11/2010 | Seong | 363/21.02 |
| 8,076,699 | B2 * | 12/2011 | Chen et al. | 257/194 |
| 2006/0125446 | A1 * | 6/2006 | Tupman et al. | 320/132 |

FOREIGN PATENT DOCUMENTS

JP 2001-251772 A 9/2001

* cited by examiner

*Primary Examiner* — Rexford Barnie
*Assistant Examiner* — Zeev V Kitov
(74) *Attorney, Agent, or Firm* — Fujitsu Patent Center

(57) ABSTRACT

A bidirectional switch device, has: a bidirectional switch having a HEMT; and a control circuit which, during a first condition, applies a first voltage lower than a threshold voltage across a gate and one terminal among a source and a drain of the HEMT to turn off a first current path from the other terminal among the source and the drain to the one terminal, and during a second condition, applies a second voltage lower than the threshold voltage across the other terminal and the gate to turn off a second current path from the one terminal to the other terminal, and further during a third condition, applies a third voltage higher than the threshold voltage across the source and the gate and across the drain and the gate of the HEMT to turn on the first and second current paths.

9 Claims, 7 Drawing Sheets

BIDIRECTIONAL SWITCH AND CHARGE/DISCHARGE PROTECTION DEVICE USING SAME

CROSS-REFERENCE TO RELATED APPLICATIONS

This application is based upon and claims the benefit of priority of the prior Japanese Patent Application No. 2011-100356, filed on Apr. 28, 2011, the entire contents of which are incorporated herein by reference.

FIELD

The embodiments relate to a bidirectional switch and to a charge/discharge protection circuit using this switch.

BACKGROUND

Power MOSFETs have source and drain regions formed within the channel region of a semiconductor substrate, and a gate electrode formed therebetween. In the case of an N-type MOSFET, the channel region is coupled to the source region with lowest potential so that a floating state does not occur. Consequently, a parasitic body diode is formed from the source region and the channel region coupled thereto, to the drain region. That is, in a normal circuit, the current path in the direction from the drain region toward the source region in an N-type MOSFET is turned on and off, but a body diode is continuously formed in the current path from the source region toward the drain region, and current is never shut off.

Hence in order to form a bidirectional switch using a power MOSFET, it has been necessary to combine two power MOSFETs, resulting in increased costs.

On the other hand, in order to prevent overcharge and overdischarge of lithium ion batteries, in addition to battery cells in a battery pack, a charge/discharge protection device to prevent overcharge and overdischarge is provided. This charge/discharge protection device has a bidirectional switch. The bidirectional switch must perform on/off switching of current in both directions, and is configured using two power MOSFETs.

It has been proposed that SITs (Static Induction Transistors) be used in bidirectional switch elements, to perform current on/off switching in both directions. One example of this is Japanese Patent Application Laid-open No. 2001-251772. However, such a bidirectional switch element takes only two states, to switch current on or off in both directions.

In USB equipment, in addition to its own internal power supply, power is also supplied to the equipment via a USB bus. Hence it is necessary to switch between the internal power supply and the USB bus power supply, and a bidirectional switch element is necessary.

SUMMARY

When SITs are used in a bidirectional switch, it is only possible to switch the current paths on or off in both directions, and switching to pass current in one direction and shut off current in the other direction is not possible.

The embodiment of a bidirectional switch device, has: a bidirectional switch having a HEMT; and a control circuit which, during a first condition, applies a first voltage lower than a threshold voltage across a gate and one terminal among a source and a drain of the HEMT to turn off a first current path from the other terminal among the source and the drain to the one terminal, and during a second condition, applies a second voltage lower than the threshold voltage across the other terminal and the gate to turn off a second current path from the one terminal to the other terminal, and further during a third condition, applies a third voltage higher than the threshold voltage across the source and the gate and across the drain and the gate of the HEMT to turn on the first and second current paths.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Secondary batteries are storage batteries or charged-type batteries which are used in a wide variety of devices and equipment, including automobiles, notebook computers, portable telephones, and similar.

Figure 1:
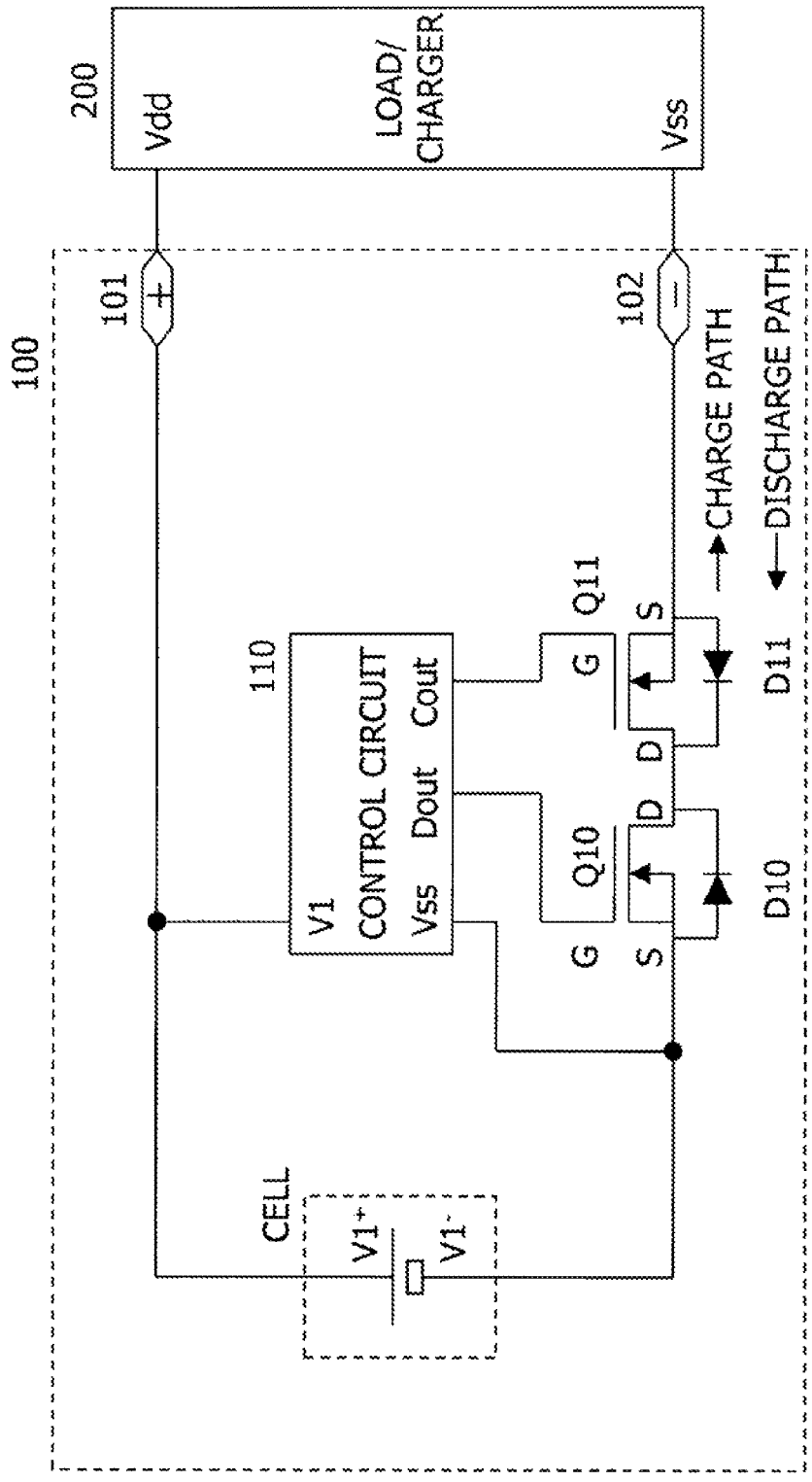
FIG. 1 illustrates the configuration of a secondary battery and a load or a charger coupled thereto.

FIG. 1 illustrates the configuration of a secondary battery and a load or a charger coupled thereto. Within the secondary battery 100 are a battery cell CELL which stores electricity; bidirectional switches Q10, Q11 provided in one of the current paths between the two terminals V1+, V1− of the battery cell CELL and one of the external terminals 101 and 102 (in the example of FIG. 1, the current paths between the negative terminal V1− of the battery cell CELL and the external terminal 102); and a control circuit 110 which controls the switches Q10, Q11. The bidirectional switches are transistors Q10, Q11, which are two MOSFETs, and are coupled in series such that the source and drain terminals S, D are in opposite directions.

When the external terminals 101, 102 of the secondary battery 100 are coupled to a charger 200, a charging current flows in the charging current path from the positive external terminal 101 toward the negative external terminal 102, the battery cell CELL is charged, and the charge voltage V1 (voltage across the two terminals V1+, V1−) rises. On the other hand, when the external terminals 101, 102 of the secondary battery 100 are coupled to a load 200, a discharging current flows in the discharging current path from the negative external terminal 102 toward the positive external terminal 101, the battery cell CELL is discharged, and the charge voltage V1 falls.

In the case of a lithium ion battery, standards prohibit charging such that the charge voltage V1 across the two terminals exceeds a first voltage (for example 4.3 V) and discharging to less than a second voltage lower than the first voltage (for example 2.3 V). Hence the control circuit 110 monitors the charge voltage V1 across the two terminals of the battery cell CELL, and: (1) when V1>4.3 V, drives the voltage Cout of the gate of the transistor Q11 to L level, below the threshold voltage, turning off the transistor Q11 and shutting off the charge path; (2) when V1<2.3 V, drives the gate voltage Dout of the transistor Q10 to L level, below the threshold voltage, turning off the transistor Q10 and shutting off the discharge path. Further, (3) when 2.3 V<V1<4.3 V, the control circuit 110 drives the gate voltages Dout and Cout of the two transistors Q10 and Q11 to H level equal to or above the threshold voltage, maintaining both transistors in the conducting state, and keeping both the charge path and the discharge path in the conducting state.

In the above case (1) where V1>4.3 V, the gate voltage Dout of the transistor Q10 is at H level, equal to or higher than the threshold voltage, and the transistor Q10 is turned on, so that the parasitic diode D11 of the transistor Q11 and the drain-source interval of the transistor Q10 are turned on, and the discharge path is in the conducting state. However, the gate voltage Cout of the transistor Q11 is below the threshold voltage and the drain-source interval is turned off, so that the charge path is in the non-conducting state.

Similarly, in case (2) where V1<2.3 V, the gate voltage Cout of the transistor Q11 is at H level, equal to or above the threshold voltage, so that the transistor Q11 is turned on, and the parasitic diode D10 of the transistor Q10 and the drain-source interval of the transistor Q11 are turned on, so that the charge path is in the conducting state. However, the gate voltage Dout of the transistor Q10 is less than the threshold voltage so that the drain-source interval is turned off, and the discharge path is in the non-conducting state.

In this way, there is a PN junction between the source-drain region and the channel region of a power MOSFET, so that a parasitic body diode is formed in the direction from source to drain. Due to the existence of this parasitic body diode, the power MOSFET is only turned on and off in the current path in the direction from drain to source. This is true not only of power MOSFETs, but also of normal MOSFETs which do not have high withstand voltages.

Figure 2:
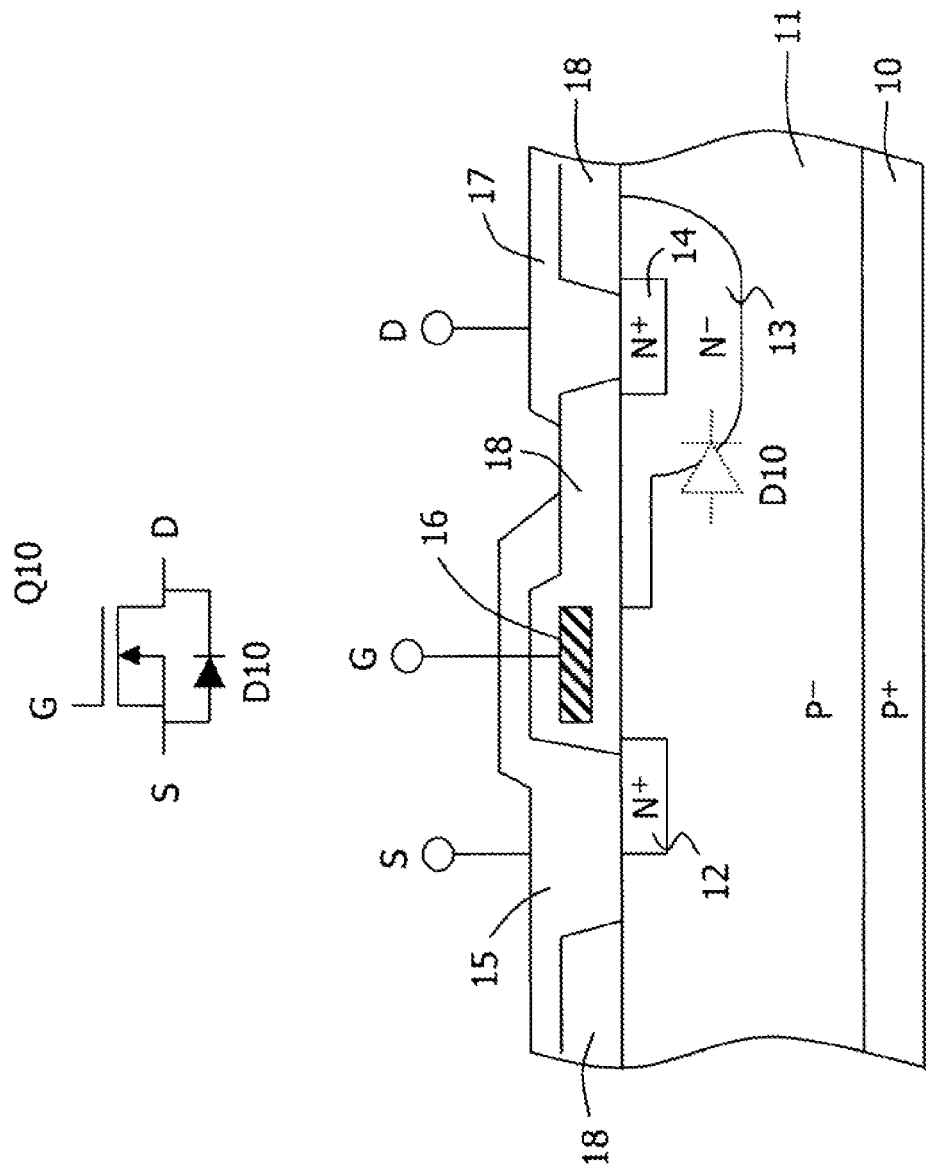
FIG. 2 illustrates the cross-sectional structure of a power MOSFET.

FIG. 2 illustrates the cross-sectional structure of a power MOSFET. This power MOSFET has a P-type channel region 11 formed in the surface portion of a P-type silicon substrate 10, an N-type source region 12 provided within the channel region 11, an N-type drain region 14, an N-type low-concentration drain region 13 on the periphery of the drain region 14, a gate electrode 16, a source electrode 15, a drain electrode 17, and an insulating film 18.

The channel region 11 is coupled to the source region 15 at lowest potential, so as to avoid a floating state. For this reason, a body diode D10 comprising a PN junction is formed from the source electrode 15 to the drain electrode 17. Due to this body diode D10, the MOSFET cannot control the current path in the direction from the source toward the drain by means of the gate voltage. What is controlled by the gate voltage is only the current path in the direction from drain to source.

As a result of the existence of this body diode D10 formed because of the power MOSFET structure, a bidirectional switch must be configured by coupling two power MOSFETs in series, as in FIG. 1.

Figure 3:
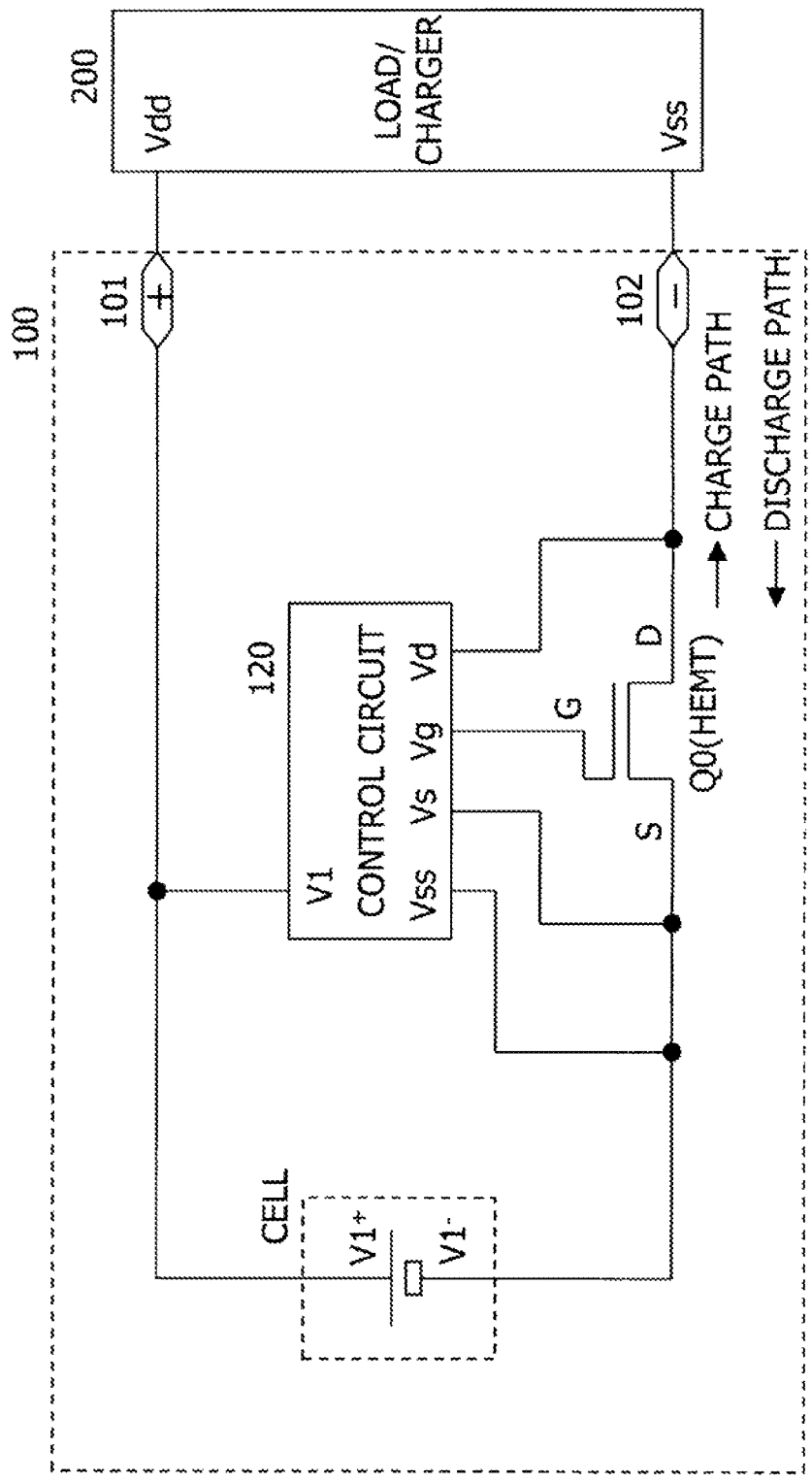
FIG. 3 illustrates the configuration of the secondary battery and the load or charger coupled thereto in this embodiment.

(Embodiments) FIG. 3 illustrates the configuration of the secondary battery and the load or charger coupled thereto in this embodiment. Within the secondary battery 100 are a battery cell CELL which stores electricity, a bidirectional switch Q0 provided in the current path of one of the two terminals V1+, V1− of the battery cell CELL (in the example of FIG. 3, the current path between the negative terminal V1− of the battery cell CELL and the external terminal 102), and a control circuit 110 which controls the bidirectional switch Q0. The bidirectional switch Q0 may also be provided in the current path between the positive terminal V1+ of the battery cell CELL and the external terminal 101.

When the charger 200 is coupled to the external terminals 101, 102, the battery cell CELL is charged with electric charge through the charging current path of the external terminal 101, the battery cell CELL, and the external terminal 102; when the external terminals 101, 102 are coupled to a load circuit, electric charge in the battery cell CELL is discharged through the discharging current path of the external terminal 102, the battery cell CELL, and the external terminal 101.

The bidirectional switch Q0 has one normally-off N-channel HEMT. The gate G, source S and drain D of this HEMT Q0 are coupled to the control circuit 120, and the control circuit 120 controls the gate-source voltage and gate-drain voltage of the HEMT Q0 according to the charging voltage across the two terminals of the battery cell CELL.

Figure 4:
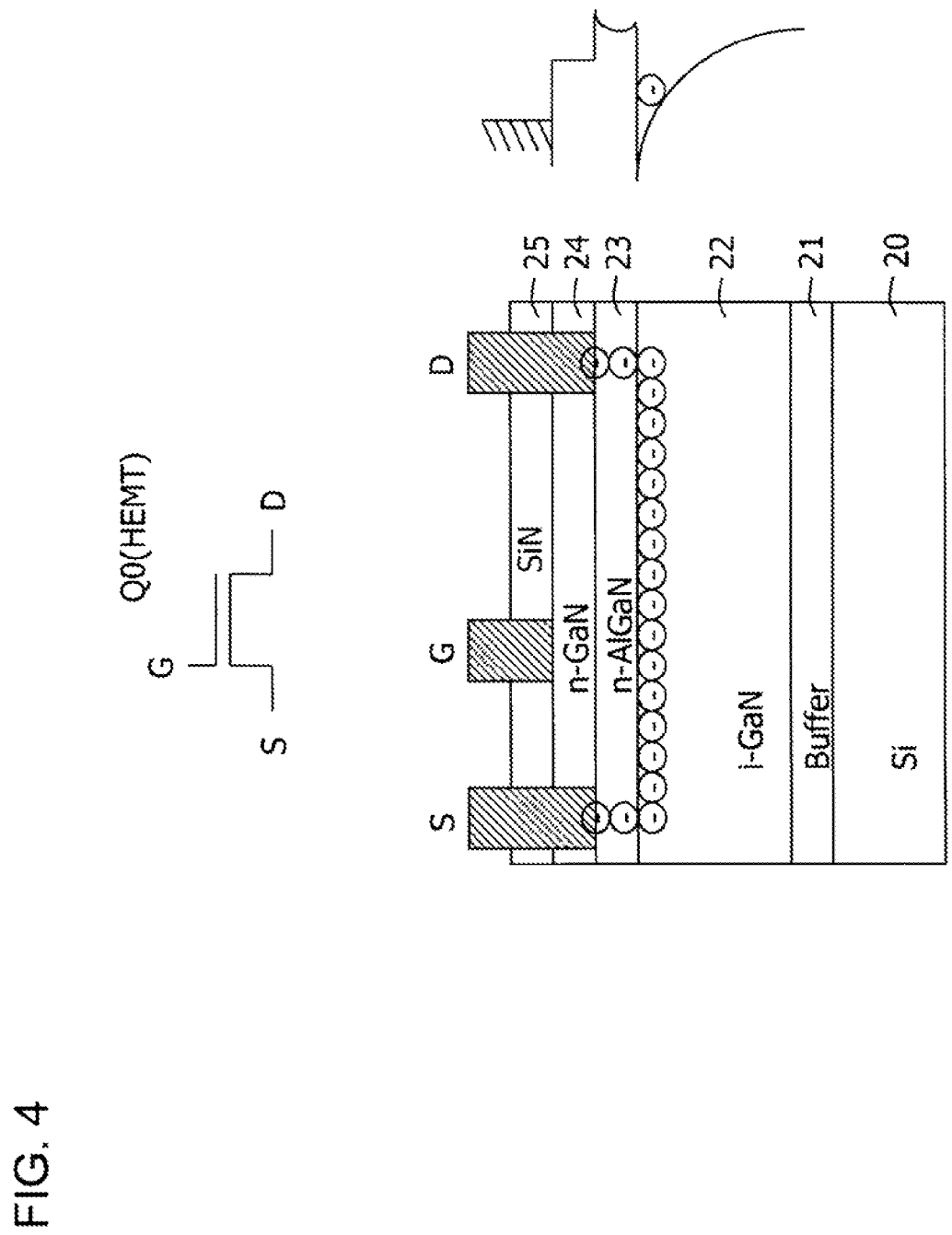
FIG. 4 is a cross-sectional view of the HEMT.

FIG. 4 is a cross-sectional view of the HEMT. This HEMT has an electron transit layer 22 having an undoped GaN layer on a silicon substrate 20, with a buffer layer 21 intervening; an electron supply layer 23 having an n-type AlGaN layer forming a heterojunction with the electron transit layer 22; a cap layer 24 having an n-type GaN layer; and an insulating layer 25 having an undoped SiN layer. The gate electrode G is provided on the cap layer 24, and the source and drain electrodes S and D are provided on the electron supply layer 23. An electron channel layer is formed within the electron transit layer 22 at the heterojunction of the electron supply layer 23 and the electron transit layer 22.

Normally a higher voltage is applied across the gate and drain than across the gate and source, and so the gate electrode is provided closer to the source. However, when utilizing current paths in both directions, the gate electrode need not be provided closer to the source.

In this HEMT, if the gate-source voltage is made less than a threshold voltage, the current path in the direction from the drain D to the source S is shut off, and if the gate-drain voltage is made less than the threshold voltage, the current path in the direction from the source S to the drain D is shut off. Further, if the gate-source voltage is made equal to or higher than the threshold voltage, current flows in the direction from the drain D to the source S, and if the gate-drain voltage is made equal to or higher than the threshold voltage, current flows in the direction from the source S to the drain D. If both the voltages across the gate and source and across the gate and drain are made equal to or higher than the threshold voltage, current flows in both directions.

The control circuit 120 in FIG. 3 monitors the charging voltage V1 across the two terminals of the battery cell CELL, and (1) when V1<2.3 V, sets the voltage across the gate G and source S to be less than the threshold voltage, shutting of the discharge path in the direction from drain D to source S, and sets the voltage across the gate G and drain D to be equal to or higher than the threshold voltage, putting the charge path in the direction from source S to drain D in a conducting state. Further, (2) when 4.3 V<V1, the control circuit 120 sets the voltage across the gate G and drain D to be less than the threshold voltage, shutting off the charge path in the direction from source S to drain D, and sets the voltage across the gate G and source S to be equal to or higher than the threshold voltage, putting the discharge path in the direction from drain D to source S in a conducting state. And, (3) when 2.3 V<V1<4.3 V, the control circuit 120 sets the gate-source voltage and the gate-drain voltage to be equal to or higher than the threshold voltage, putting both the discharge path and the charge path into the on (conducting) state.

As illustrated in FIG. 4, there is no P-type layer in an N-type HEMT, and so there is no PN junction present to form a parasitic body diode as in the case of a power MOSFET. Hence a single HEMT performs operations not to turn on and off a current path in a single direction, but to separately turn on and off the current paths in both directions, and also turn on and off the current paths in both directions.

Further, in the case of a HEMT the current paths in both directions are turned on and off, so that if the source is coupled to a potential higher than that at the drain, a current path is formed in the direction from the source to the drain. In this way the source region is not always the source of the transistor; depending on the potential states of the source and drain, one among the source and drain may function as the drain and the other as the source, or one may function as the source and the other as the drain. Below, for convenience one among the source and drain is called the source S, and the other is called the drain D.

Figure 5:
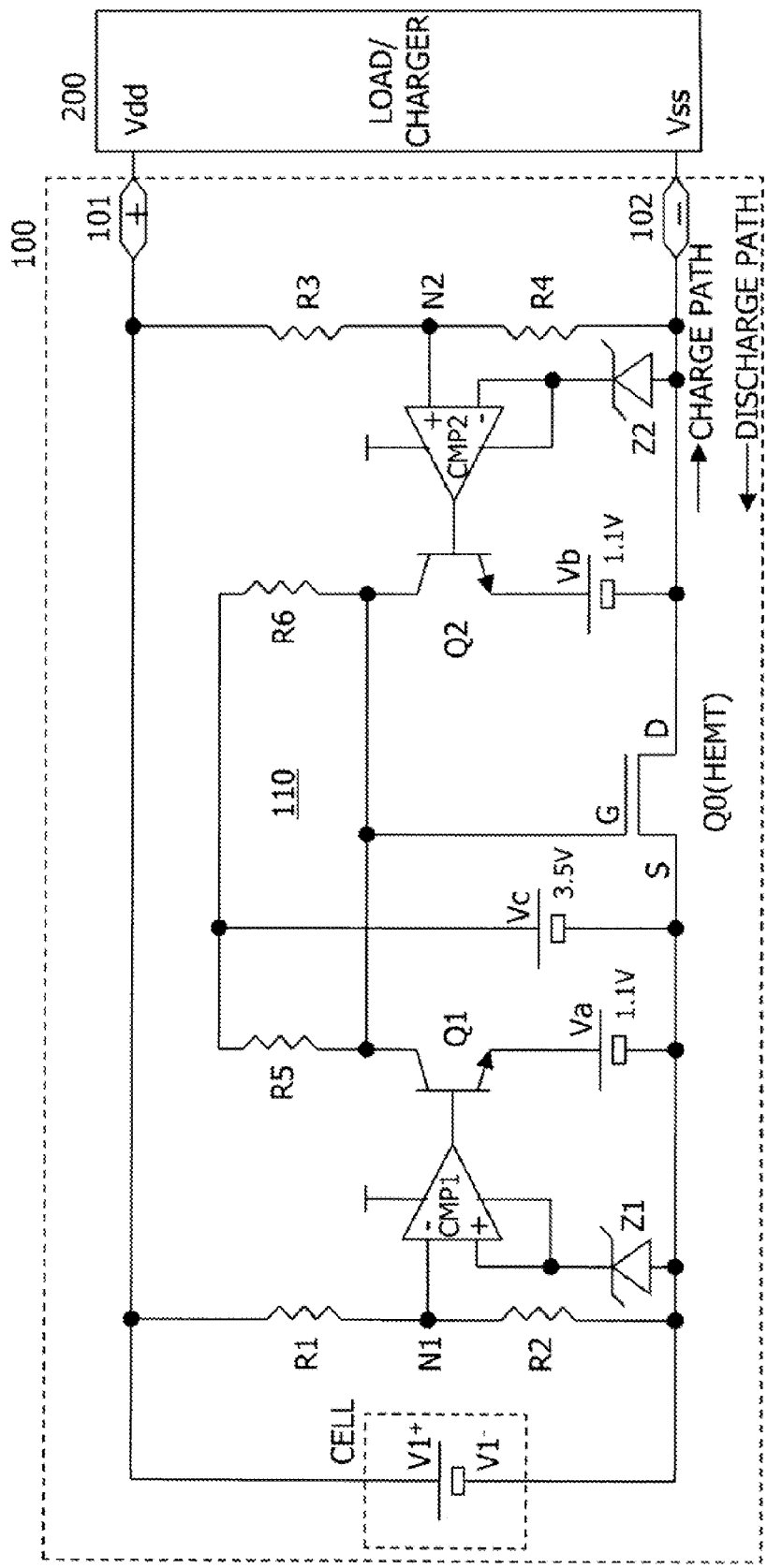
FIG. 5 illustrates an example of the circuit of the control circuit 110 in this embodiment.

FIG. 5 illustrates an example of the circuit of the control circuit 110 in this embodiment. The NPN transistor Q1 is a switching element which connects or disconnects between a constant voltage Va coupled to the source S and the gate G, and is turned on when the output of the comparator CMP1 is at H level, so that the gate-source of the HEMT Q0 is clamped at Va=1.1, lower than the threshold voltage Vth (for example 1.5 V), but when at L level is turned off.

The positive electrode input of the comparator CMP1 is coupled to the cathode of a Zener diode Z1, and the node N1, which voltage-divides the voltage V1 across the two terminals of the battery cell CELL ((V1+)−(V1−)) using resistors R1 and R2, is coupled to the negative electrode input. The resistance values of the resistors R1 and R2 are set such that when the voltage V1 across the terminals of the battery cell CELL exceeds 2.3 V, the voltage at node N1 exceeds the voltage of the Zener diode. Hence the output of the comparator CMP1 goes to H level when the voltage V1 across the two terminals of the battery cell is V1<2.3 V, so that the transistor Q1 is caused to conduct, and the gate-source voltage of the HEMT Q0 is clamped at the constant voltage Va=1.1 V. As a result, the discharge path in the direction from the drain D to the source S of the HEMT is shut off.

However, the transistor Q2 is in the off state, and the low voltage Vc=3.5 V, higher than the threshold voltage Vth, is applied across the gate G and drain D, so that the charge path in the direction from the source S to the drain D is in the on state.

On the other hand, the NPN transistor Q2 is a switching element which connects or disconnects between a constant voltage Vb coupled to the drain D and the gate G, and is turned on when the output of the comparator CMP2 is at H level, so that the gate-drain of the HEMT Q0 is clamped at Vb=1.1 V, lower than the threshold voltage Vth, but when at L level is turned off.

The negative electrode input of the comparator CMP2 is coupled to the cathode of a Zener diode Z2, and the node N2, which voltage-divides the voltage V1 across the two terminals of the battery cell CELL ((V1+)−(V1−)) using resistors R3 and R4, is coupled to the positive electrode input. The resistance values of the resistors R3 and R4 are set such that when the voltage V1 across the terminals of the battery cell CELL exceeds 4.3 V, the voltage at node N2 exceeds the voltage of the Zener diode. Hence the output of the comparator CMP2 goes to H level when the voltage V1 across the two terminals of the battery cell is 4.3 V<V1, so that the transistor Q2 is caused to conduct, and the gate-drain voltage of the HEMT Q0 is clamped at the constant voltage Va=1.1 V. As a result, the charge path in the direction from the source S to the drain D of the HEMT is shut off.

However, the transistor Q1 is in the off state, and the low voltage Vc=3.5 V, higher than the threshold voltage Vth, is applied across the gate G and source S, so that the discharge path in the direction from the drain D to the source S is in the on state.

When the voltage V1 across the two terminals of the battery cell CELL is 2.3 V<V1<4.3 V, the outputs of the comparators CMP1, CMP2 are both at L level. As a result, the transistors Q1 and Q2 are both turned off, and a constant voltage Vc (=3.5 V) is applied to the gate G via the resistors R5 and R6. Hence if the source S and drain D are close to ground potential VSS, the HEMT Q0 is in a bidirectional conducting state, conducting in both the charge path direction and in the discharge path direction. That is, both the path for charging by the charger and the path for discharging to a load device of the battery cell CELL are in the on state.

As the power supply of the comparators CMP1 and CMP2, a constant voltage, not illustrated, is used.

The voltage drop is large across the GaN HEMT in the reverse direction in the off state, that is, the reverse direction between source and drain or between drain and source in the off state. This large voltage drop is undesirable for a switch. Hence rather than lowering the gate voltage to zero voltage with respect to the source or drain, the gate voltage is only lowered to a voltage slightly below the threshold voltage Vth (Va, Vb=1.1 V), so that the off-state reverse-direction voltage drop is made small. This is because if the low voltage Va, Vb were made zero volts, the off-state reverse-direction voltage difference would be too large.

The bidirectional switch HEMT is not limited to a HEMT with a GaN electron transit layer; HEMTs using GaAs and InGaAs similarly do not have a parasitic body diode, and so is applied in this embodiment. However, in the case of GaN the band gap is large and the withstand voltage is high, and so such a HEMT is suitable as a power transistor.

Figure 6:
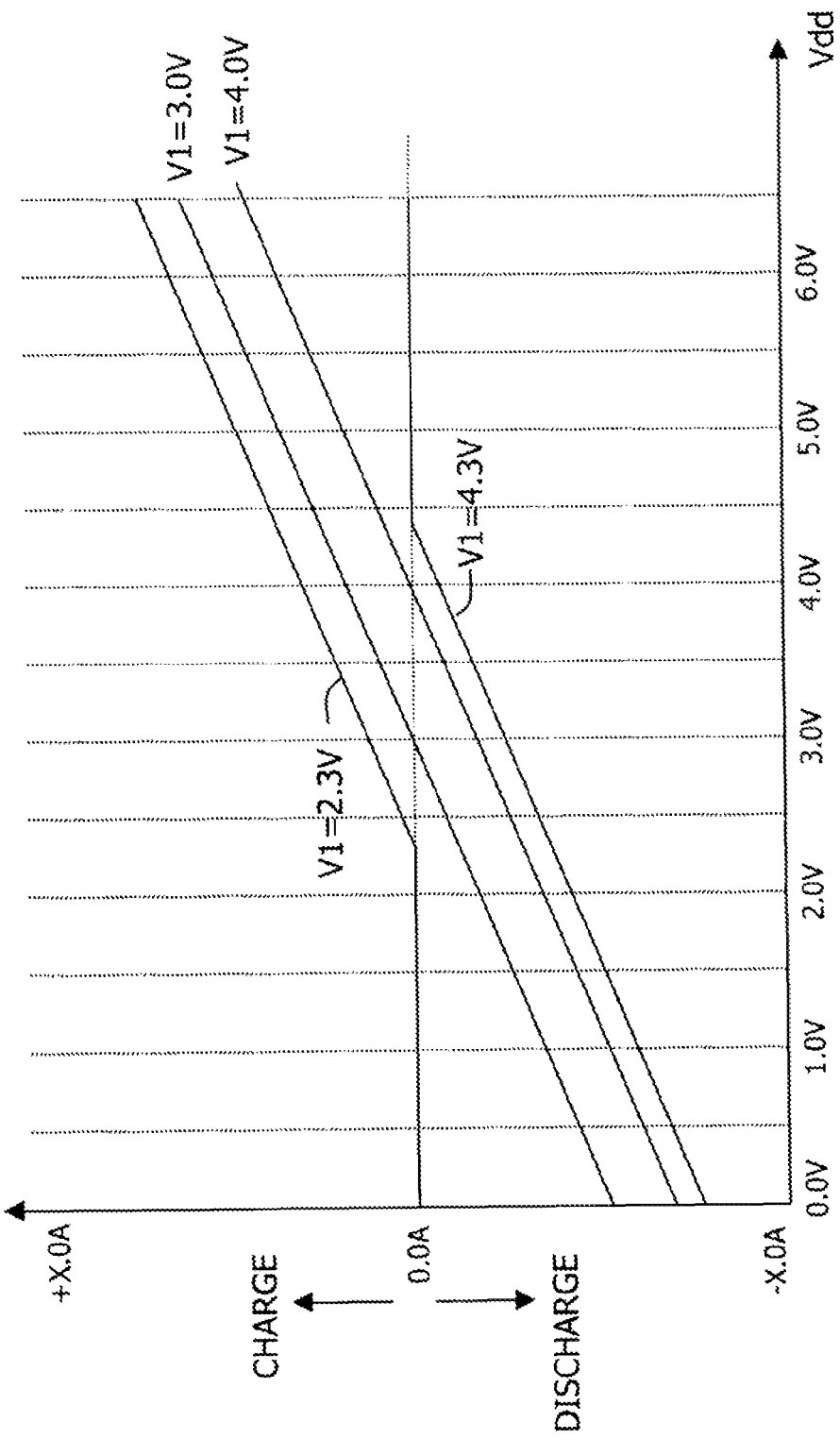
FIG. 6 illustrates operation characteristics of the bidirectional switch of this embodiment.

FIG. 6 illustrates operation characteristics of the bidirectional switch of this embodiment. The horizontal axis illustrates the voltage Vdd of the load/charger 200 coupled to the external terminal 101 of the secondary battery 100, and the vertical axis illustrates the charging or discharging current flowing in the secondary battery 100. The positive side of 0.0 A on the vertical axis is a charging current, and the negative side indicates a discharging current. Here Vss is taken to be 0 V. FIG. 6 illustrates the respective charge/discharge current characteristics when the voltage V1 across the two terminals of the battery cell CELL within the secondary battery is 2.3 V, 3.0 V, 4.0 V, and 4.3 V.

When V1=3.0 V, the HEMT Q0 of the bidirectional switch is in the conducting state in both directions, and so when the voltage Vdd of the load/charger 200 exceeds 3.0 V a charging current flows, and when at less than 3.0 V a discharge current flows. When V2=4.0 V also, the HEMT Q0 is in a bidirectional conducting state, and operation is similar.

When V1=2.3 V, the discharge path of the HEMT Q0 of the bidirectional switch is turned off, and the charge path is turned on. That is, the gate-source voltage is clamped at Va=1.1 V, but the gate-drain voltage is at Vc=3.5 V, exceeding the threshold voltage Vth, so that the discharge path is turned off, and the charge path is turned on. Hence if the voltage Vdd exceeds 2.3 V a charging current flows, and under 2.3 V a discharge current does not flow. When V1 is less than 2.3 V, a charge current flows regardless of the voltage Vdd, but no discharge current flows.

Conversely, when V1 is 4.3 V, the charge path of the HEMT Q0 of the bidirectional switch is turned off, and the discharge path is turned on. That is, the gate-drain voltage is clamped at Vb=1.1 V, but the gate-source voltage is at Vc=3.5 V, exceeding the threshold voltage Vth, so that the charge path is turned off, and the discharge path is turned on. Hence if the voltage Vdd exceeds 4.3 V, a charging current does not flow, and under 4.3 V, a discharge current flows. When V1 exceeds 4.3 V, no charge current flows, regardless of the voltage Vdd, but a discharge current flows.

In this way, the bidirectional switch of this embodiment has three states, which are the state in which the current paths in both directions are turned on, the state in which the current path is turned off in only the one direction from source to drain, and the state in which the current path is turned off in only the one direction from drain to source. Of course, by clamping the gate-source and gate-drain voltages at 1.1 V, the current paths in both directions are also turned off.

In this embodiment, the single HEMT comprised by the bidirectional switch shuts off current in one direction to prevent overcharging, shuts off current in the other direction to prevent overdischarging, and passes current in both directions to allow charging and discharging.

Figure 7:
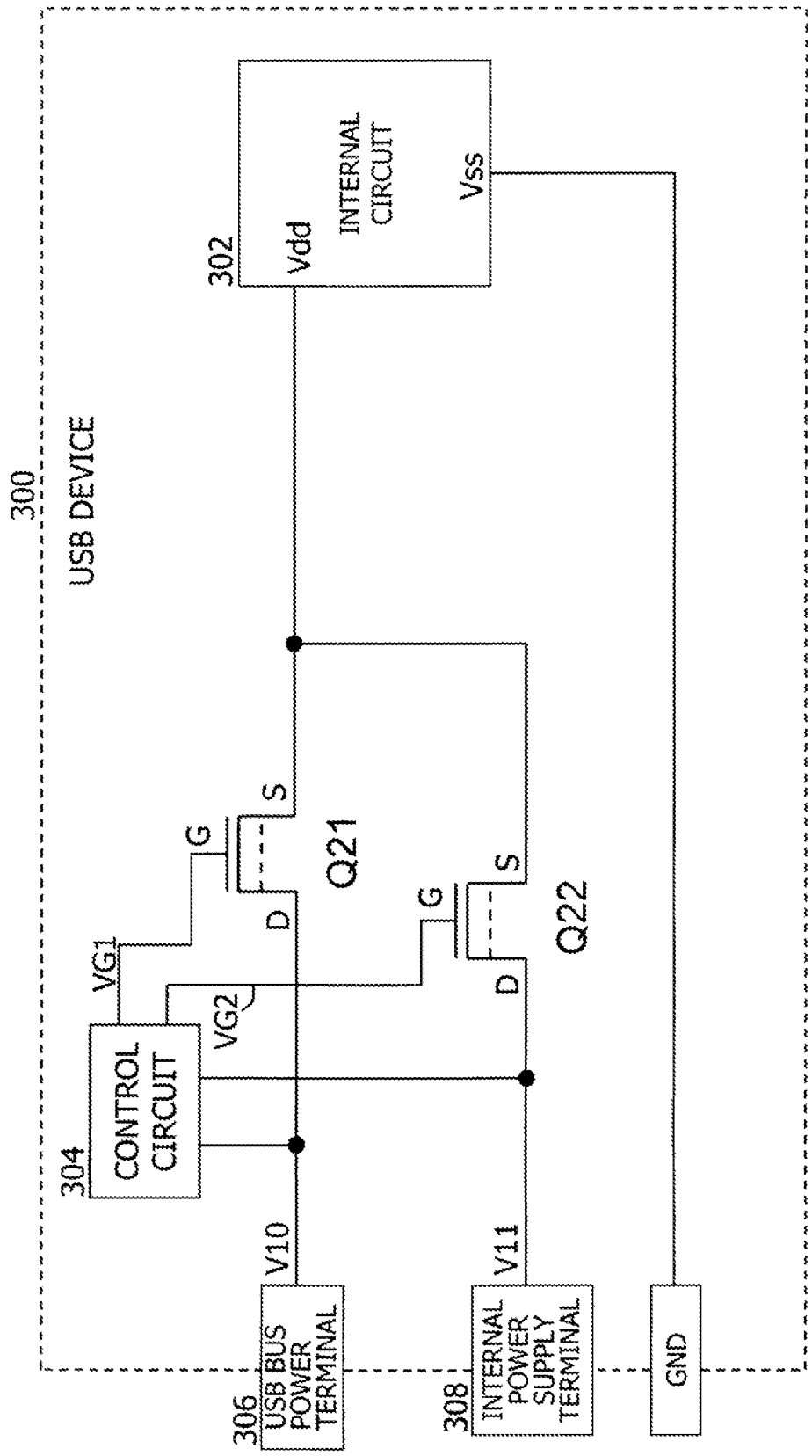
FIG. 7 illustrates the bidirectional switch device of a second embodiment.

FIG. 7 illustrates the bidirectional switch device of a second embodiment. In this example, the USB device 300 which is coupled via USB has bidirectional switches Q21 and Q22 to control the current path of the USB bus and the current path of the internal power supply.

The internal circuit 302 of the USB device 300 is supplied with the power supply Vdd from either the USB bus power supply terminal 306 or from the internal power supply terminal 308. The internal power supply is for example an AC adapter or an internal battery power supply. Hence bidirectional switches Q21, Q22 comprising a single HEMT each are provided between the power supply terminals 306, 308 and the power supply Vdd, and the gate-source voltages and gate-drain voltages of these HEMTs are controlled by the control circuit 304.

In the USB device, of the two power supply terminals 306 and 308, the power supply of the internal power supply terminal 308 is for example given priority. That is, (1) when the regulation voltage is applied to the internal power supply terminal 308, the voltage on the side of the internal power supply terminal 308 is supplied to the power supply Vdd of the internal circuit 302, regardless of the voltage state of the USB bus power supply terminal 306. On the other hand, (2) when the regulation voltage is not applied to the internal power supply terminal 308 (0 V or open circuit), but the regulation voltage is applied to the USB bus power supply terminal 306, the voltage of the USB bus power supply terminal 306 is supplied to the power supply Vdd of the internal circuit 302.

Hence in the case of (1) above, at least the current path in the direction from drain D to source S of the HEMT Q22 is turned on, and the current paths in both directions of the HEMT Q21 are turned off. By this means, the power supply current from the internal power supply terminal 308 is kept from flowing to the USB bus power supply terminal 306. In order that at least the current path in the direction from drain D to source S of the HEMT Q22 be turned on, the control circuit 304 controls the gate-source voltage to be equal to or higher than the threshold voltage. The control circuit 304 also controls the gate-source voltage and gate-drain voltage of the HEMT Q21 to be less than the threshold voltage. As stated above, these voltages below the threshold voltage are low voltages slightly lower than the threshold voltage Vth; for example, 1.1 V is desirable. By this means, the reverse-direction voltage drop in the off state is kept small.

In the case of (2) above, at least the current path in the direction from drain D to source S of the HEMT Q21 is turned on, and the current paths in both directions of the HEMT Q22 are turned off. By this means, the power supply current from the USB bus power supply terminal 306 is kept from flowing to the internal power supply terminal 308. In order that at least the current path in the direction from drain D to source S if the HEMT Q21 be turned on, the control circuit 304 controls the gate-source voltage to be equal to or higher than the threshold voltage. The control circuit 304 also controls the gate-source voltage and gate-drain voltage of the HEMT Q22 to be less than the threshold voltage.

In the second embodiment also, HEMTs are used as switches capable of controlling the current paths in both directions, and the number of switch elements is reduced.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention has been described in detail, it should be understood that the various changes, substitutions, and alterations could be made hereto without departing from the spirit and scope of the invention.

What is claimed is:

1. A bidirectional switch device, comprising:
  a single HEMT being provided in a bidirectional current path including a first current path and a second current path; and
  a control circuit which, during a first condition, applies a first voltage lower than a threshold voltage between a gate of the single HEMT and one terminal among a source and a drain of the single HEMT to turn off the first current path from the other terminal among the source and the drain to the one terminal, and applies a fourth voltage equal to or higher than the threshold voltage between the gate and the other terminal to turn on the second current path from the one terminal to the other terminal, and during a second condition, applies a second voltage lower than the threshold voltage between the other terminal and the gate to turn off the second current path, and applies a fifth voltage equal to or higher than the threshold voltage between the gate and the one terminal to turn on the first current path, and further during a third condition, applies a third voltage equal to or higher than the threshold voltage between the source and the gate and between the drain and the gate to turn on the first and second current paths.

2. A charge/discharge protection device, comprising:
  a single HEMT provided in a bidirectional current path between two terminals of a battery cell, and the bidirectional current path including a charge current path with one direction between the two terminals of the battery cell and a discharge current path with other direction between the two terminals of the battery cell; and
  a control circuit which, when the voltage of the battery cell exceeds a first charging voltage, applies a first voltage lower than a threshold voltage between a gate of the single HEMT and one terminal among a source and a drain of the single HEMT to turn off the charge current path from the other terminal among the source and the drain to the one terminal of the single HEMT, and applies a fourth voltage equal to or higher than the threshold voltage between the gate and the other terminal to turn on the discharge current path from the one terminal to the other terminal of the single HEMT, and when the voltage of the battery cell is lower than a second charging voltage below the first charging voltage, applies a second voltage lower than the threshold voltage between the gate and the other terminal to turn off the discharge current path, and applies a fifth voltage equal to or higher than the threshold voltage between the gate and the one terminal to turn on the charge current path, and further when the voltage of the battery cell is lower than the first charging voltage and higher than the second charging voltage, applies a third voltage equal to or higher than the threshold voltage between the source and the gate and between the drain and the gate to turn on both the charge current path and the discharge current path.

3. The charge/discharge protection device according to claim 2, wherein the control circuit has a circuit which monitors the charge voltage between the two terminals of the battery cell.

4. The bidirectional switch device according to claim 1, wherein the first or second voltage lower than the threshold voltage is a voltage higher than zero voltage and lower than the threshold voltage.

5. The bidirectional switch device according to claim 1, wherein the single HEMT has an electron transit layer formed of a GaN semiconductor layer.

6. The charge/discharge protection device according to claim 2, wherein the first or second voltage lower than the threshold voltage is a voltage higher than zero voltage and lower than the threshold voltage.

7. The charge/discharge protection device according to claim 2, wherein the single HEMT has an electron transit layer formed of a GaN semiconductor layer.

8. The bidirectional switch device according to claim 1, wherein the single HEMT does not have a parasitic body diode between the source and drain.

9. The bidirectional switch device according to claim 2, wherein the single HEMT does not have a parasitic body diode between the source and drain.

* * * * *